(12) United States Patent
Venugopal et al.

(10) Patent No.: US 10,461,747 B2
(45) Date of Patent: Oct. 29, 2019

(54) LOW POWER CLOCK GATING CIRCUIT

(71) Applicant: Apple Inc., Cupertino, CA (US)

(72) Inventors: Vivekanandan Venugopal, San Jose, CA (US); Michael R Seningen, Austin, TX (US); Ajay Bhatia, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/710,406

(22) Filed: Sep. 20, 2017

(65) Prior Publication Data

US 2019/0089354 A1 Mar. 21, 2019

(51) Int. Cl.
*H03K 19/00* (2006.01)
*H03K 5/134* (2014.01)

(52) U.S. Cl.
CPC ......... *H03K 19/0016* (2013.01); *H03K 5/134* (2014.07)

(58) Field of Classification Search
CPC ........... H03K 19/0016; H03K 19/0008; H03K 19/001; H03K 19/0013; H03K 19/0019; H03K 5/134; H03K 5/13

USPC ........................................................ 327/434
See application file for complete search history.

(56) References Cited

U.S. PATENT DOCUMENTS

| 8,671,380 B2 | 3/2014 | Wang |
| 9,270,270 B2 * | 2/2016 | Cai ................ H03K 3/356052 |
| 9,660,620 B1 | 5/2017 | Zyuban |

* cited by examiner

*Primary Examiner* — Patrick C Chen
(74) *Attorney, Agent, or Firm* — Meyertons, Hood, Kivlin, Kowert & Goetzel, P.C.

(57) ABSTRACT

A clock gating circuit is disclosed. The clock gating circuit includes an input circuit configured to receive an enable signal and clock enable circuitry configured to receive an input clock signal. The clock gating circuit also includes a latch that captures and stores an enabled state of the enable signal when the enable signal is asserted. An output circuit is coupled to the latch, and provides an output signal corresponding to a state of the clock signal when the latch is storing the enabled state. The clock gating circuit is arranged such that, when the latch is not storing the enabled state, no dynamic power is consumed responsive to state changes of the input clock signal.

16 Claims, 11 Drawing Sheets

LOW POWER CLOCK GATING CIRCUIT

BACKGROUND

Technical Field

This disclosure is directed to electronic circuits, and more particularly, to clock gating circuits.

Description of the Related Art

Digital electronic systems utilize a number of different types of synchronous circuits for controlling the movement of information. Flip-flops are commonly used and implemented in a wide variety of systems and circuit. A flip-flop circuit includes one or more data inputs, a clock input, and one or more data outputs. Logic signals may be received on the data input(s) of a flip-flop circuit. Responsive to an edge (e.g., a rising edge) of the clock signal, the logic values of these signals may be captured and stored in the flip-flop circuit, with these values being stored until another synchronizing edge (e.g., the next rising edge) is received. Between these edges, the flip-flop circuit stores the captured logic value.

Clock signals may be provided to these flip-flop circuits via a clock gating circuit. Clock gating circuits may be part of a clock tree (or clock distribution network) having a number of different levels. Clock gating circuits that are coupled directly to clock consumers, such as the flip-flop circuits mentioned above, may be referred to as being at the leaf-level. When enabled, clock gating circuits allow a received clock signal to propagate downstream, e.g., to the clock consumers. The clock gating circuits may also be disabled at certain times to reduce power consumption. When disabled, a clock gating circuit inhibits the received clock signal from propagating further.

SUMMARY

A clock gating circuit is disclosed. In one embodiment, a clock gating circuit includes an input circuit configured to receive an enable signal and clock enable circuitry configured to receive an input clock signal. The clock gating circuit also includes a latch that captures and stores an enabled state of the enable signal when the enable signal is asserted. An output circuit is coupled to the latch, and provides an output signal corresponding to a state of the clock signal when the latch is storing the enabled state. The clock gating circuit is arranged such that, when the latch is not storing the enabled state, no dynamic power is consumed responsive to state changes of the input clock signal.

In one embodiment, the clock gating circuit is arranged, when the enabled state is not stored, to hold the output signal to a predetermined state irrespective of the state of the input clock signal. As noted above, the circuit is arranged such that it does not consume dynamic power responsive to state changes (e.g., the normal cycling of) the input clock signal when the latch is not storing the enabled state. Dynamic power may be defined herein as power that is consumed in direct response to the switching of transistors, e.g., from an off state to an on state. Thus, the arrangement of the clock gating circuit may reduce overall power consumption by substantially eliminating dynamic power consumption when the clock gating circuit is not enabled.

BRIEF DESCRIPTION OF THE DRAWINGS

The following detailed description makes reference to the accompanying drawings, which are now briefly described.

Figure 1:
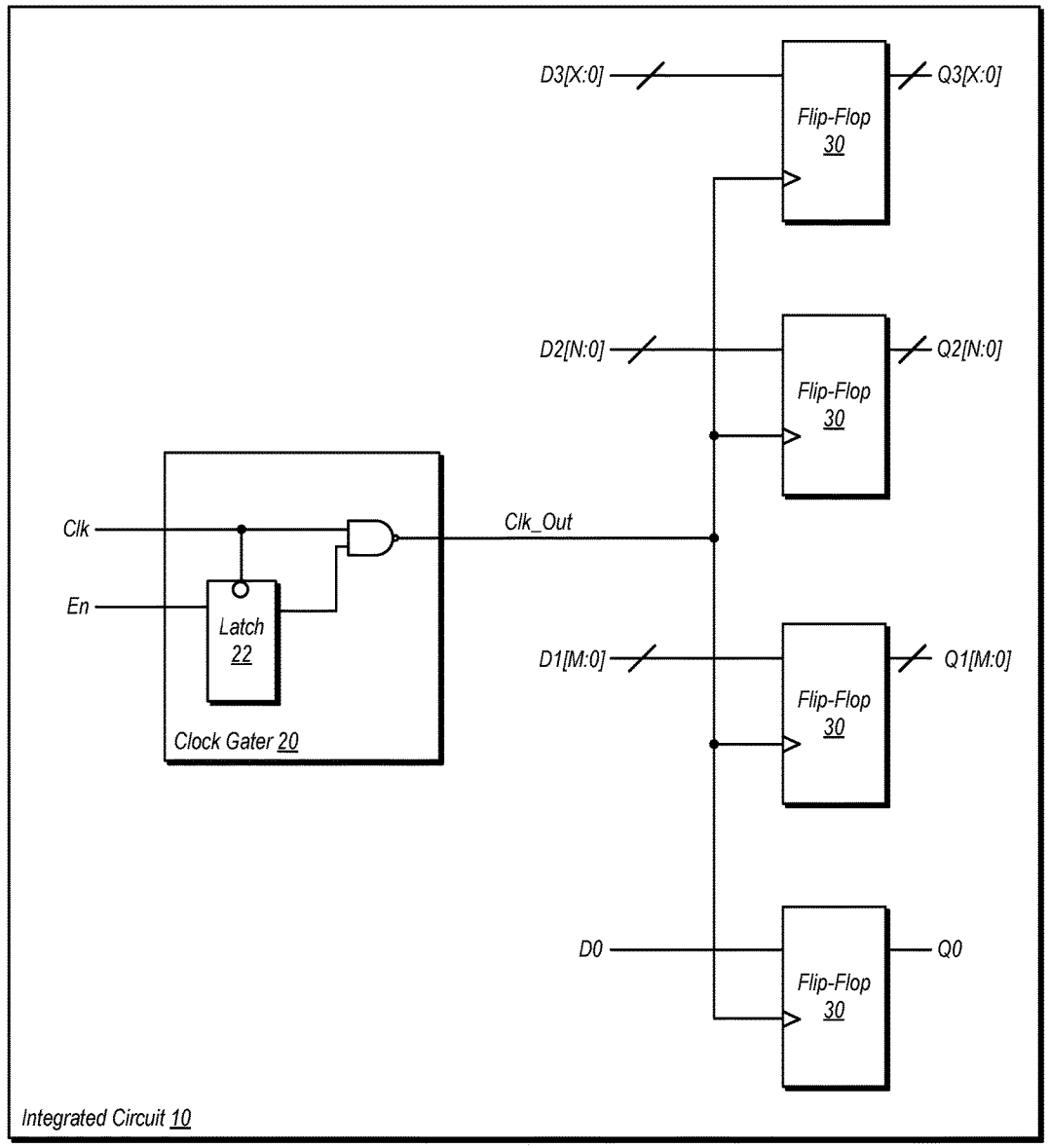
FIG. 1 is a block diagram of one embodiment of an integrated circuit (IC) having a number of flip-flops coupled to receive a clock signal via a clock gating circuit.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

Turning now to FIG. 1, a block diagram of one embodiment of an IC is shown. It is noted that the embodiment shown here is not intended to be limiting. Instead, FIG. 1 is a simplified diagram presented for the purpose of illustrating certain concepts of the present disclosure, as are discussed below.

During some portions of the discussion, a clock signal may be referred to as having an active state and an inactive state. For example, a clock signal in an embodiment of the circuitry discussed herein may be considered active when at a logic high voltage, and inactive when the clock is at a logic low voltage. Accordingly, the scope of this disclosure may thus include circuits in which the clock is considered active at either a logic high or logic low voltage, and inactive in the opposite state.

In the illustrated example, IC 10 includes a clock gating circuit, clock gater 20, which is coupled to receive an input clock signal ('Clk') and an enable signal ('En').

When the enable signal is asserted, clock gater 20 allows the output clock signal ('Clk_Out') to be provided to the various flip-flops 30. When the enable signal is de-asserted, Clk_Out is inhibited, being held to particular logic level. In an alternative embodiment, a clock signal 'Clk_B', which is the logical complement of Clk_Out, may be provided as the output clock signal.

In the embodiment shown, the various flip-flop circuits 30 include a single-bit flip-flop, as well as a number of multi-bit flip-flops. The number of data bits received and output by each of the flip-flops 30 may vary from one embodiment to the next, and may be any feasible number.

One notable feature of the embodiment shown herein, and discussed in more detail below, is that all inversions of the clock signal are provided within clock gater 20. In this particular case, clock gater 20 provides a single inversion of the clock signal in the circuitry therein. On the contrary, none of the flip-flops 30 in the embodiment provide any inversions of the clock signal. Typical flip-flop circuit provide one or more inversions of a clock signal. The reducing of inversions of the clock signal may result in notable power savings, particularly in cases involving the implementation of large numbers of the various embodiments of flip-flops 30 discussed herein.

The clock gater 20 may also include power saving features. In particular, certain transistors implemented therein that receive (one respective gate terminals) are arranged such that no dynamic power is consumed thereby when the clock gater 20 is not in an enabled state. Dynamic power, as defined herein, may be the power consumed by various circuits in direct response to a transistor or transistors switching from one state to another (e.g., off to on, or on to off). Thus, the clock gater 20 of FIG. 1, and various embodiment shown in other figures are arranged in a manner that when the input clock signal changes states, dynamic power consumption occurs only if the clock gater 20 itself is in the enabled state, as stored by latch 22. Otherwise, if the clock gater 20 is not in the enabled state, no dynamic power is consumed responsive to the changing state of the input clock signal. Various embodiments of clock gating circuits that can be utilized as clock gater 20 will now be discussed in further detail.

Figure 2:
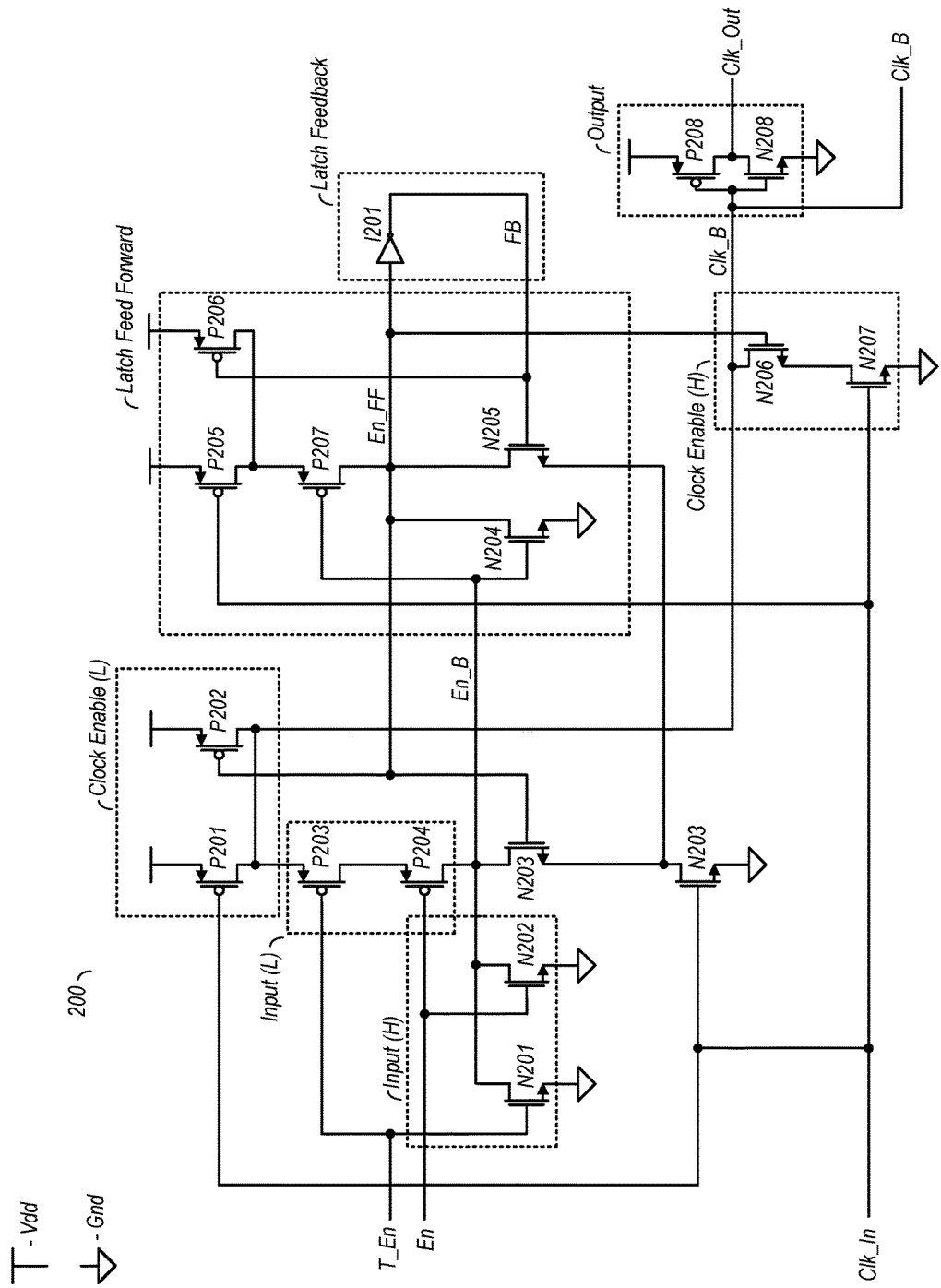
FIG. 2 is a schematic diagram of one embodiment of a clock gating circuit.

FIG. 2 is a schematic diagram of one embodiment of a clock gating circuit. In the embodiment shown, clock gater 200 is configured to receive an input clock signal, Clk_In, and, when enabled, provide a corresponding output clock signal, Clk_Out. The output clock signal may be provided at the same logic level as the input clock signal in this particular embodiment. However, it is possible that the output clock signal may be provided from, e.g., the Clk_B node, in an inverted state from the input clock signal (this also applies to the embodiment shown in FIG. 3). The embodiment shown in FIG. 2 may be suitable for use with various types of flop circuits, such as those shown in FIGS. 7 and 8 (but is not limited to use with such embodiments).

Clock gater 200 in the embodiment shown includes an input circuit (shown here as Input(H) and Input(L)), a latch circuit that includes a latch feed forward circuit and a latch feedback circuit, clock enable circuitry (including Clock Enable (L) and Clock Enable (H), and an output circuit. The input circuit in the embodiment shown is configured to receive an enable signal ('En'; which may also be referred to as the operational enable signal) and a test enable signal ('T_En'). Assertion of either one of these signals may enable clock gater 200 by causing the latch to store the enabled state. Typically, the test enable signal is used during test operations, but may otherwise remain de-asserted. During normal operation, the operational enable signal may be used as the signal to enable or disable clock gater 200. In this particular embodiment, the operational and test enable signals are active (asserted) high and inactive (de-asserted) when low. However, embodiments in which these signals are active low and inactive high are also possible and contemplated.

Assertion of at least one of the enable signals may cause the latch of clock gater 200 to be placed into (or store) an enabled state. For example, assertion of the operational enable signal in the embodiment shown results in the activation of NMOS transistor N202. When N202 is active, the node En_B is pulled low, thereby causing activation of PMOS transistor P207. If the input clock signal is also low (which may be considered its inactive state in this embodiment), P205 may also be activated. This accordingly provides a pull-up path between the feed forward node, En_FF, which is then pulled up toward the supply voltage Vdd. The high on En_FF is received as an input to the latch feedback circuit, which includes inverter I201 in this embodiment. The output of I201 provides the feedback signal, FB. When En_FF is pulled high, the feedback signal is output as low, thereby activating P206. When P206 is active, the pull-up path between En_FF and Vdd, through P207, remains even when the input clock signal is high (which results in the deactivation of P205). The latch of clock gater 202 may be considered to be storing the enabled state when En_FF is pulled high as described in this paragraph. The operation described herein may be largely identical responsive to assertion of the test enable signal, with the exception that N201 is activated (with N202 remaining inactive if the operational enable signal is de-asserted).

When the latch is storing the enabled state, the state of the output clock signal may follow the state of the input clock signal. When En_FF is pulled high, transistor N206 is activated. Responsive to Clk_In transitioning high, transistor N207 is activated. As a result, Clk_B is pulled low toward ground through the pull-down path provided by N206 and N207. When Clk_B is pulled low, the output circuit (which includes an inverter implemented with P208 and N208), the output clock signal is provided as high. When the clock falls low when the latch is storing the enabled state, N207 is deactivated, while P201 is activated. When P201 is active, a pull-up path is provided between Clk_B and Vdd, thereby causing Clk_Out to be provided as low.

Clock gater 200 may enter a disabled state when neither of the enable signals are asserted. When both enable signals are inactive in this particular embodiment, both P203 and P204 are activated. If the clock is low at this point in the operation, P201 is also active. Thus, a pull-up path exists between En_B and Vdd through P201, P203 and P204. When En_B is pulled high, N204 is activated, and thus En_FF is pulled low. When En_FF is pulled low, P202 is activated while I201 outputs a high on the feedback node. The high on the feedback node activates N205. This may result in another pull-down path from En_FF through N203 when the input clock signal transitions high. When En_FF is low, and thus P202 is active, Clk_B is pulled high and Clk_Out is thus held low, irrespective of the state of the input clock signal.

The latch circuitry in clock gater 200 in the illustrated embodiment is arranged such that it is responsive to state changes of the input signal only when the input clock signal is low. When the input clock signal is high, the current state (enabled or disabled) is retained until the clock falls low again. For example, if the En signal changes from de-asserted to asserted when the input clock signal is high, En_B falls low due to the activation of N202. However, En_FF is prevented from being pulled high at this time, as P205 is off (due to the input clock signal being high). Furthermore, the feedback signal output by I201 is high, causing N205 to be active. Since the input clock is also high at this point, N203 is also active, and En_FF is pulled down through N203 and N205. The feed forward node remains low until the clock transitions high again. Upon transitioning high, En_FF is pulled up through P201, while the pull-down path is cut off responsive to the de-activation of N203.

The operation described in the previous paragraph is similar when the enable signals transition to a de-asserted state when the input clock signal is high. When both of the enable signals are low in the illustrated embodiment, but the input clock signal is high, the pull-up path between En_B is blocked. Accordingly, En_B cannot cause a change to En_FF (by causing activation of N204) until the clock falls low again.

The arrangement of transistors in clock gater 200 is such that the circuit does not consume dynamic power, responsive to transitions of the input clock signal, when the latch is not storing the enabled state. In the embodiment shown, transistors P201, P205, N203, and N207 are each arranged to receive the input clock signals on respective gate terminals. When the latch circuitry of clock gater 200 is not storing the enabled state, En_B is pulled high, while En_FF is pulled low. When En_FF is low, P202 is active, and thus provides a pull-up path from Clk_B to Vdd. Similarly, En_FF is pulled low through N204. Transistor N205 is also active due to the high on FB, while P207 is inactive due to the high on En_B. Thus, the source-drain voltage across P201 is substantially zero due to pull-up path through P202.

When P201 is activated responsive to the input clock signal falling low, there is no substantial change in voltage between its source and drain terminals due to the pull-up path from Clk_B to Vdd through P202. Meanwhile, since P207 is inactive (due to the high on En_B), the pull-up path between En_FF and Vdd is blocked, and thus the low on the gate terminal of P205 has no effect. When the input clock signal transitions high, the activation of N203 has negligible, if any effect on power consumption, as En_FF is already pulled low toward ground through the parallel pull-down path through N204. Meanwhile, since N206 is inactive, the pull-down path between Clk_B and ground through N207 is thus blocked, and thus the high on the gate terminal of the latter device results in no substantial change in power consumption. Since there is no substantial change in dynamic power consumption due to the switching of devices P201, P205, N203, and N207, when the latch is not storing the enabled state, the overall power consumption of clock gater 200 may be significantly reduced.

Figure 3:
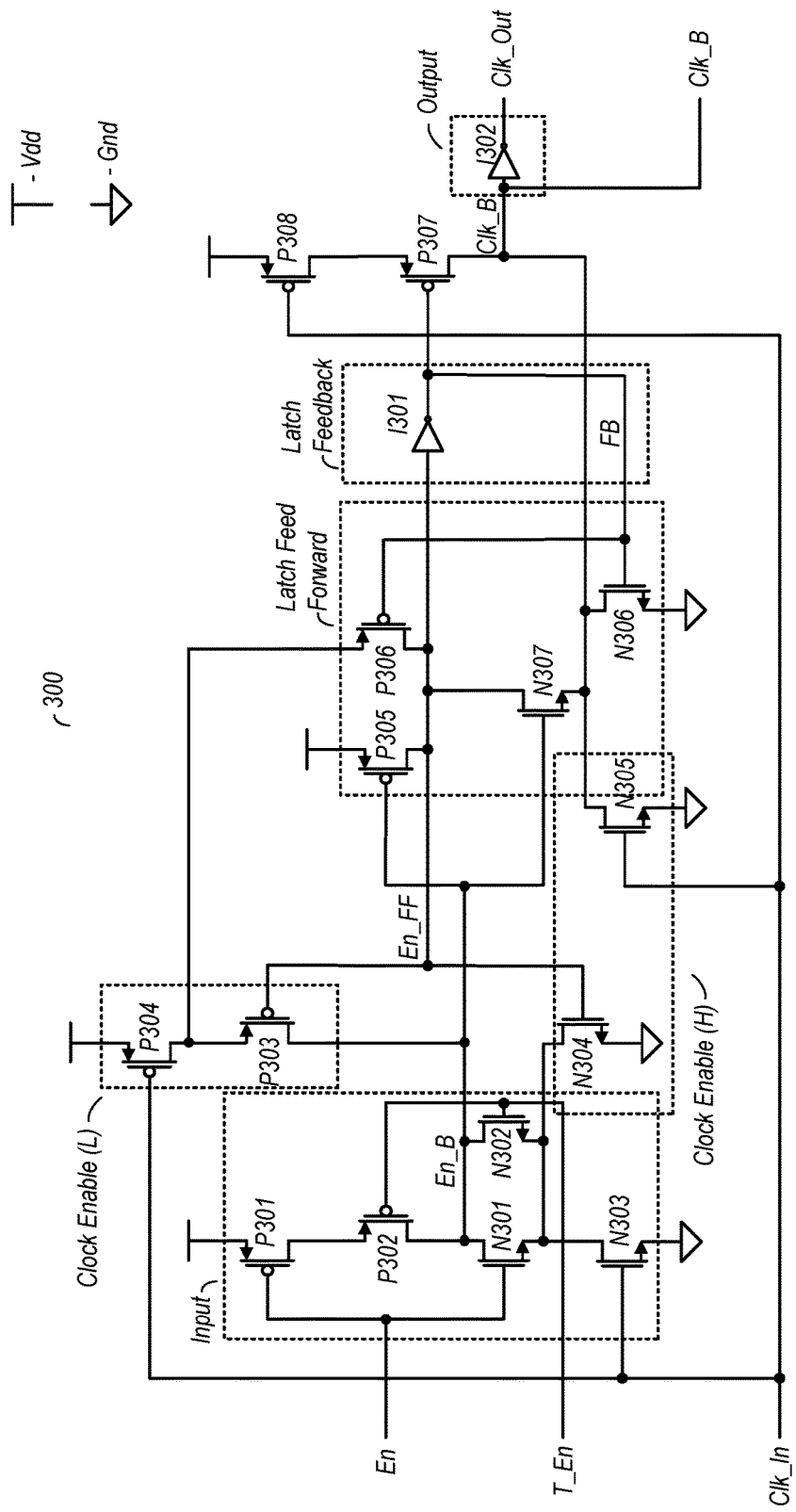
FIG. 3 is a schematic diagram of another embodiment of a clock gating circuit.

FIG. 3 is a schematic diagram of another embodiment of a clock gating circuit. In the embodiment shown, clock gater 300 includes an input circuit, a latch circuit including a latch feed forward circuit and a latch feedback circuit, an output circuit, and clock enable circuitry (shown here as Clock Enable (H) and Clock Enable (L)). The embodiment shown in FIG. 3 may be suitable for use with flop circuits such as those shown in FIGS. 5 and 6 (although it is not limited to use with such embodiments).

Clock gater 300 in the embodiment shown functions in a manner that is largely similar to clock gater 200 of FIG. 2. The primary difference between these two circuits, in terms of functionality, is that the latch of clock gater 300 engages (or captures) the state of the enable signals when the clock is high, rather than when the clock is low as in clock gater 200. Additionally, when the latch is not storing the enabled state (e.g., both enable signals de-asserted) clock gater 300 holds the output, Clk_Out, to a high rather than a low as in clock gater 200.

As with clock gater 200, clock gater 300 is arranged such that there is no substantial change to dynamic power consumption, responsive to changing levels of the input clock signal, when the latch is not storing the enabled state. In this embodiment, transistors P304, P308, N304, and N305 are each coupled to receive the input clock signal on respective gate terminals. When the latch is not storing the enabled state, En_B is pulled high through P301 and P302 (since both En and T_En are low at this point of operation). The feed forward node En_FF is thus pulled low through N307 and N306, the latter of these devices being active since the feedback node FB is high due to being a complement of En_FF. Since N306 is active, Clk_B is also pulled low. Transistor P306 is also inactive at this time due to the high on the feedback node FB, while P303 is active due to the low on the feed forward node En_FF. Meanwhile, the high on the gate of P307 holds this device at an inactive state, thereby blocking a pull-up path between Clk_B and Vdd. Additionally, since En and T_En are low, both N301 and N302 are held inactive, thereby blocking a pull-down path between En_B and ground.

When the input clock signal switches from high to low, the blocking of the pull-up path between Clk_B and Vdd by P307 negates any substantial affect that P308 would have on dynamic power consumption. Since En_B is already pulled high through active devices P301 and P302, the activation of a parallel pull-up path resulting from the activation of P304 does not result in any substantial change to dynamic power consumption.

When the input clock signal switches from low to high, the activation of N303 does not result in any substantial change to dynamic power consumption due to the pull-down path between En_B and ground being blocked by inactive devices N301 and N302. The activation of N305 similarly does not result in any substantial change in dynamic power consumption due to the fact that a parallel pull-down path between Clk_B and ground exists through the active device N306.

Figure 4:
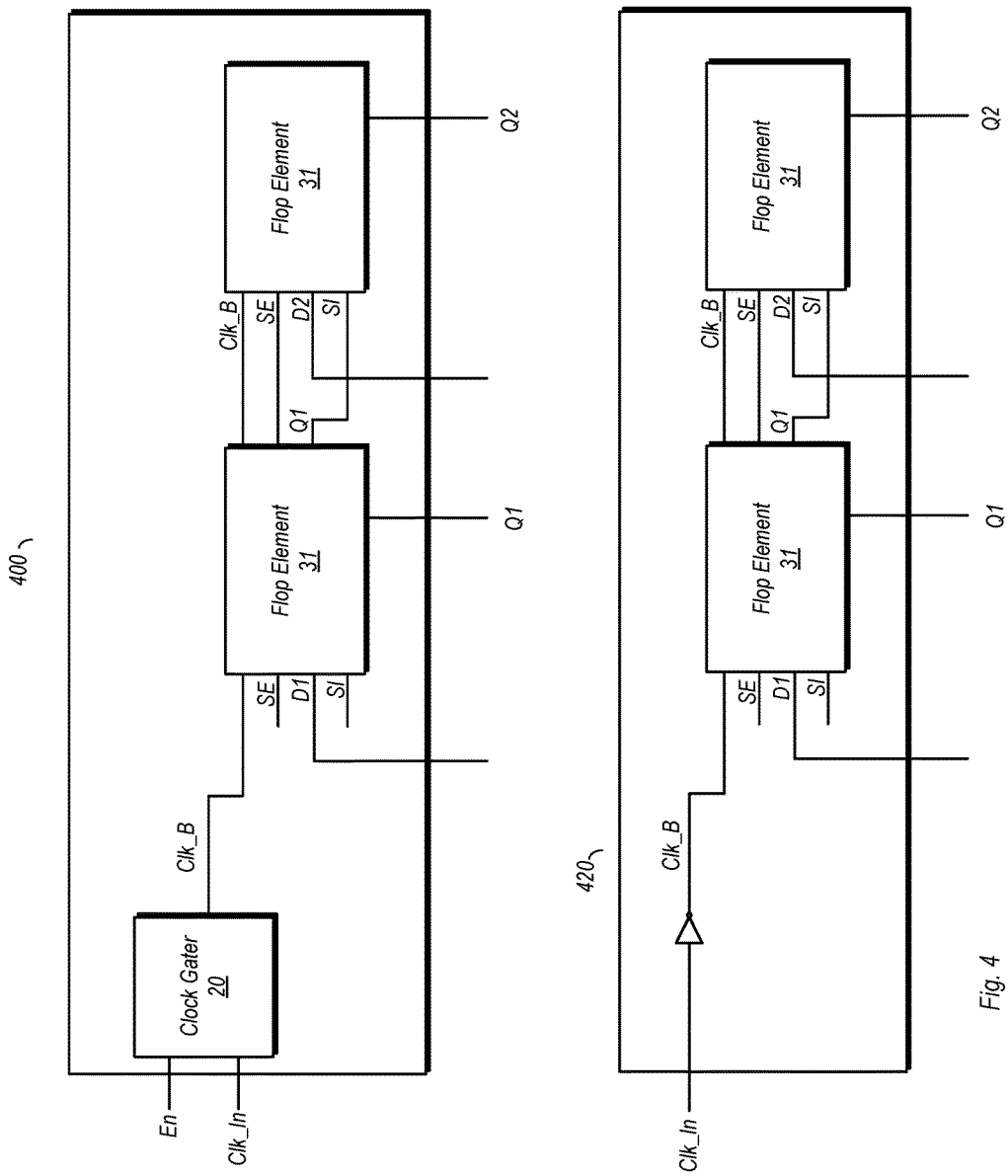
FIG. 4 is a block diagram illustrating another embodiment of an IC having a multi-bit flop with an integrated clock gating circuit.

FIG. 4 is a block diagram illustrating different embodiments of an IC having a multi-bit flop with an integrated clock gating circuit. In the illustrated example, flip-flop 400 is a two-bit flip-flop, although embodiments of any number of bits are possible and contemplated. Flip-flop 400 as shown here includes an integrated clock gater 20, which can be either of the embodiments discussed above or any variation that falls within the scope of this disclosure (but otherwise not discussed explicitly herein).

In the embodiment shown in the upper portion, flip-flop 400 includes two flop elements 31, which may be flip-flop circuits according to the various embodiments discussed herein and variations thereof. Other types of flop circuits not explicitly discussed herein may also be used to implement flip-flop 400. In this particular example, flop elements 31 are coupled to receive a clock signal Clk_B, which is a complement of the input clock signal received by clock gater 20, Clk_In. However, in various embodiments, the flop circuits 31 may be triggered either by a positive edge of a clock signal or a negative edge of a clock signal.

In addition to data and clock inputs, flop elements 31 each include inputs suitable for performing scan test, namely the SI and SE inputs. The SI input may be used to shift in test stimulus data for conducting a scan test. The SE input may be used to enable the flop elements 31 for scan test, including the shifting in of test stimulus data through the SI inputs.

The embodiment shown in the lower portion of FIG. 4 is similar to that as shown in the upper portion, the primary difference being the lack of a clock gater. Instead, a single inverter is provided to invert the clock signal such that the flop circuit 31 each receive Clk_B.

Figure 5:
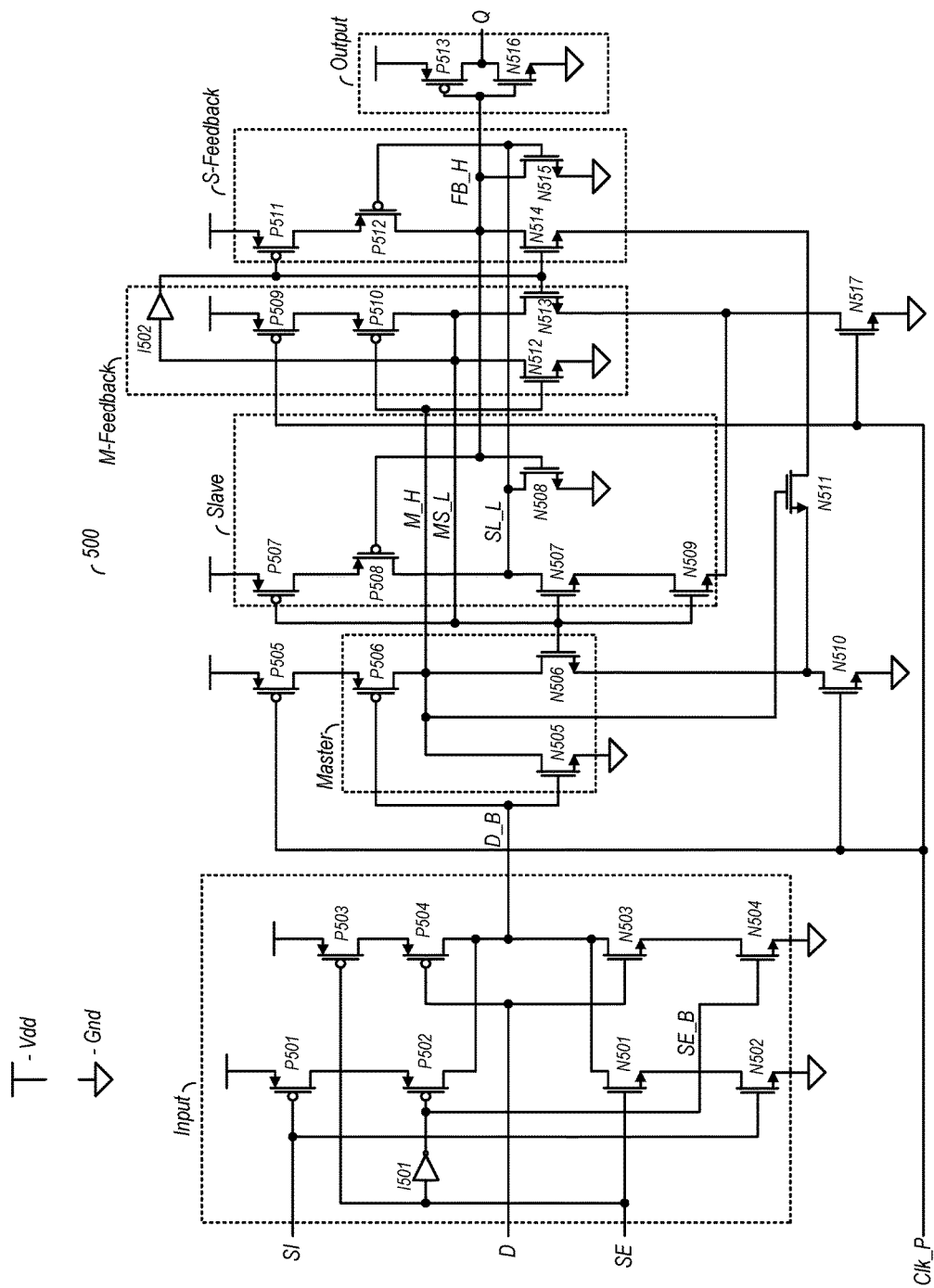
FIG. 5 is a schematic diagram of one embodiment of a flip-flop circuit.

FIG. 5 is a schematic diagram of one embodiment of a flip-flop circuit. In the embodiment shown, flip-flop 500 is a positive-edge triggered flip-flop, i.e. the output signal reflects the state of the input signal responsive to the rising edge of the input clock signal ('Clk_P') in this embodiment.

Flip-flop 500 in the embodiment shown includes an input circuit, a latch having a master portion and a slave portion, a master feedback circuit ('M-Feedback'), a slave feedback circuit ('S-Feedback'), and an output circuit. Circuitry in flip-flop 500 may be combined with other instances of the same to form a multi-bit flip-flop circuit.

The input circuit in the illustrated embodiment includes an operational data input, 'D', a scan data input, 'SI', and a scan enable input, 'SE'. The scan data input is used to input scan data during scan test operations, which may occur when the scan enable input is asserted (as a logic high in this particular example). Otherwise, during normal operation of flip-flop 500, all data is input through the operational data input, with the scan enable signal de-asserted and the circuit non-transparent to any data present on the scan data input. It is noted that the circuitry to support scan testing is optional, and thus need not be present in all possible embodiments.

When the scan enable signal is de-asserted in this embodiment, a low is provided to the gate terminal of P503, while a high is provided to the gate terminal of N504 (on the node 'SE_B', via inverter I501). Data input into the operational data input of the input circuit results in a complement of the data being provided on the node labeled 'D_B'. If the operational data input receives a logic high, N503 is activated, and D_B is pulled low through N503 and N504. If the operational data input receives a logic low, P504 is activated, and D_B is pulled high through P504 and P503.

The master latch node, M_H, is responsive to the logic value present on D_B. When D_B is provided as a low, P506 is activated and (assuming the clock is low), M_H is pulled high via the pull-up path through P505 and P506. If D_B is provided as a high, N505 is activated and thus M_H is pulled low.

The logic value placed on the M_H node may cause the activation of one of transistors P510 or N512. If M_H is high, N512 is activated, and the MS_L node is pulled low. If M_H is low, P510 is activated, and if the clock is also low, the MS_L node is pulled high via the pull-up path through P510 and P509.

The node MS_L is coupled to provide a feedback signal from the master feedback circuitry to the master latch circuitry (specifically to N506 in this embodiment) as well as to devices in the slave latch (N507 and N509 in the illustrated example). The logic value driven onto MS_L provided to the input of inverter I502, which outputs a complementary logic value to the gate terminals of P511 and N514. Additionally, the logic value on MS_L is also provided to the gate terminals of P507, N507, and N509. A logic high on MS_L causes activation of N507 and N509, while a logic low on this node causes activation of P507. Additionally, the output of I502, if high, activates N514, and if low, activates P511.

The FB_H node in the embodiment shown is arranged to convey a feedback signal from the slave feedback circuitry to the slave latch. In the embodiment shown, the logic levels driven onto nodes SL_L and FB_H depend not only on the logic level driven onto MS_L, but also on the clock transitioning high (or, more generally, to its active state). If MS_L is high, the transitioning of the clock signal from low to high creates a pulldown path between SL_L and ground through N507 and N509 and N517 (the latter which is activated responsive to the clock transitioning high). When SL_L is pulled low, P512 is activated, while P511 is activated due to the low output from I502. Accordingly, FB_H is pulled high through the active pull-up path through P511 and P512. Additionally, N508 is activated responsive to the high on FB_H, thereby providing another pulldown path between SL_L and ground.

If MS_L is low, I502 outputs a high to the gate of N514. When the clock signal transitions high, a pulldown path is thus provided between FB_H and ground through N514, N511 (active due to the high on MH_H) and N510 (activated responsive to the clock transitioning high). When FB_H is pulled low, P508 is activated. Since MS_L is also low, P507 is active at this point. Thus, a pull-up path between SL_L and Vdd is provided through P507 and P508, thereby causing SL_L to be pulled high. The high on SL_L is also provided to the gate of N515, thereby providing another pulldown path between FB_H and ground.

In this particular embodiment, the output signal is the complement of the feedback signal conveyed on FB_H. The output circuit as shown here is an inverter including transistors P513 and N516. The output signal, Q, is driven at the same logic value as the input signal received at D after the clock signal has transitioned to its active state.

Figure 6:
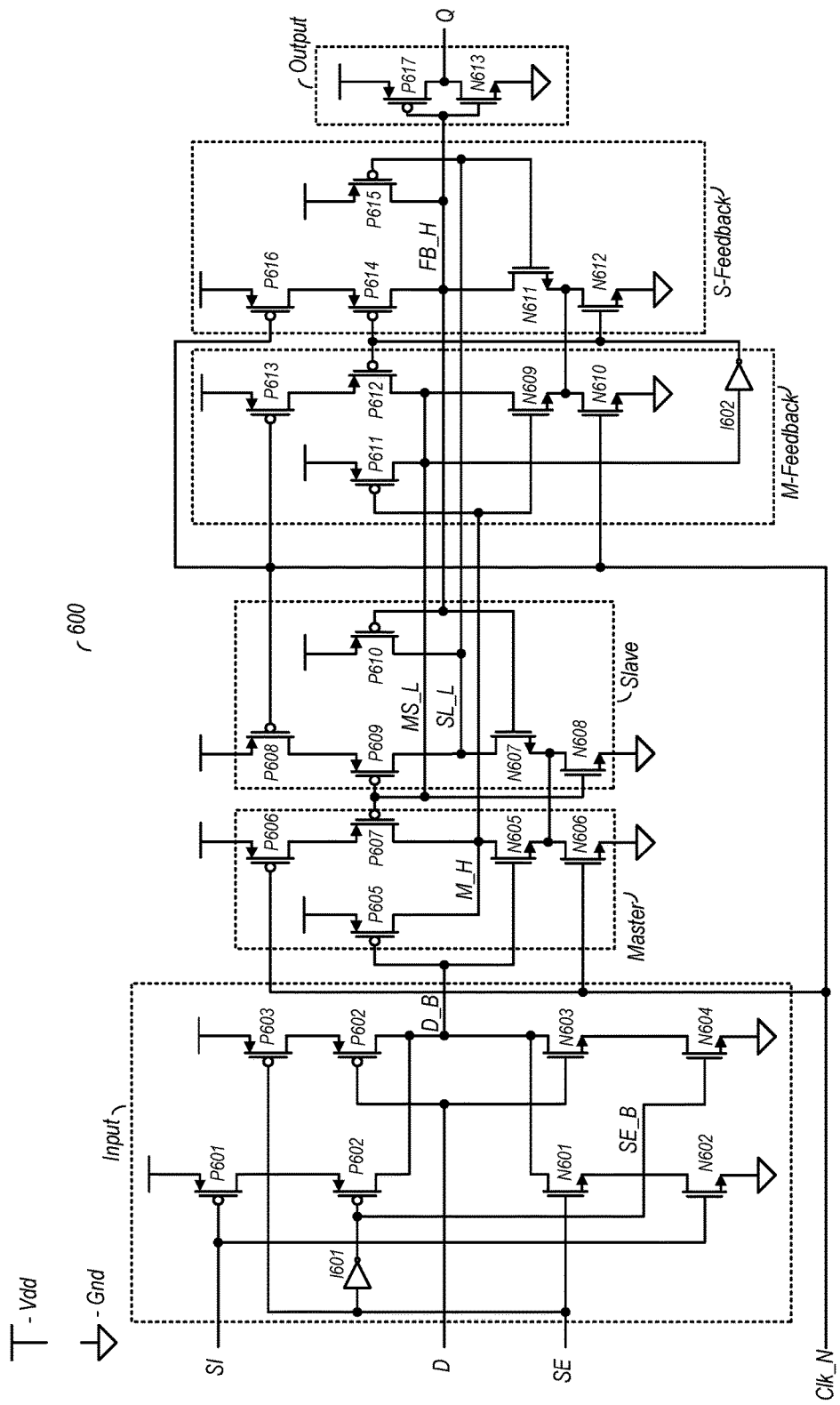
FIG. 6 is a schematic diagram of second embodiment of a flip-flop circuit.

In the illustrated embodiment, transistors P505, N510, N517, and P509 are each coupled (via other devices) to drive corresponding data nodes in flip-flop 500. Transistor P505 in the embodiment shown is arranged to drive the master latch node M_H high when the clock is low and P506 is active. Transistor N510 is configured to, drive M_H low (via N506). Transistor P509 is arranged to drive MS_L high (via P510), while transistor N517 is arranged to drive MS_L low (via N513) and SL_L low (via N507 and N509). These are the only transistors in this embodiment which are directly responsive to the clock signal. Furthermore, there are no transistors implemented in the circuit solely for the purpose of providing an inversion of the clock signal FIG. 6 is a schematic diagram of second embodiment of a flip-flop circuit. In the embodiment shown, flip-flop 600 includes an input circuit, master and slave latches, master and slave feedback circuits, and an output circuit. The input circuit shown here is arranged similarly to that of flip-flop circuit 500 of FIG. 5, and thus functions largely in the same manner.

The primary difference between the embodiment of FIG. 5 and flip-flop 600 as shown in FIG. 6 is that the latter is responsive to the falling edge of the clock signal rather than the rising edge (and hence the labeling of the input clock signal as 'Clk_N'). More particularly, the SL_L and FB_H nodes are arranged such that any state changes to these nodes occur when the clock signal is low.

When M_H is at a logic high, MS_L is at a logic low. Responsive to the low on MS_L, transistor P609 is activated. Additionally, the low on MS_L results in a high output from inverter I602, thereby resulting in the activation of N612. When the clock signal falls low, P608 is activated and thus a pull-up path is provided, via P609, between SL_L and Vdd. When SL_L is pulled high, N611 is activated to provide a pulldown path, through N612, between FB_H and ground. With FB_H pulled low, the output circuit provides a high on the output Q.

When M_H is at a logic low, MS_L is at a logic high. The logic high on MS_L activates transistor N608, while the resulting low output from I602 activates P614. When the clock signal falls low, P616 is activated, thereby creating a pull-up path between FB_H and Vdd, via the active P614. When FB_H transitions high, N607 is activated, and thus a pulldown path, via N608, is provided between SL_L and ground. Furthermore, the high on FB_H results in a low output Q.

In this particular embodiment, transistors P606, N606, N610, P608, P613, and P616 are coupled to receive the input clock signal on respective gate terminals. Transistors P606 and N606 are arranged to drive M_H, via P607 and N605, respectively.

Transistor P608 is arranged to drive SL_L, via P609. Transistors P613 and N610 are arrange to drive MS_L, via transistors P612 and N609, respectively. Transistor P616 is configured to drive FB_H, via P614. As with the previously discussed flip-flop embodiment, no inversions of the clock signal are provided in flip-flop 600.

Figure 7:
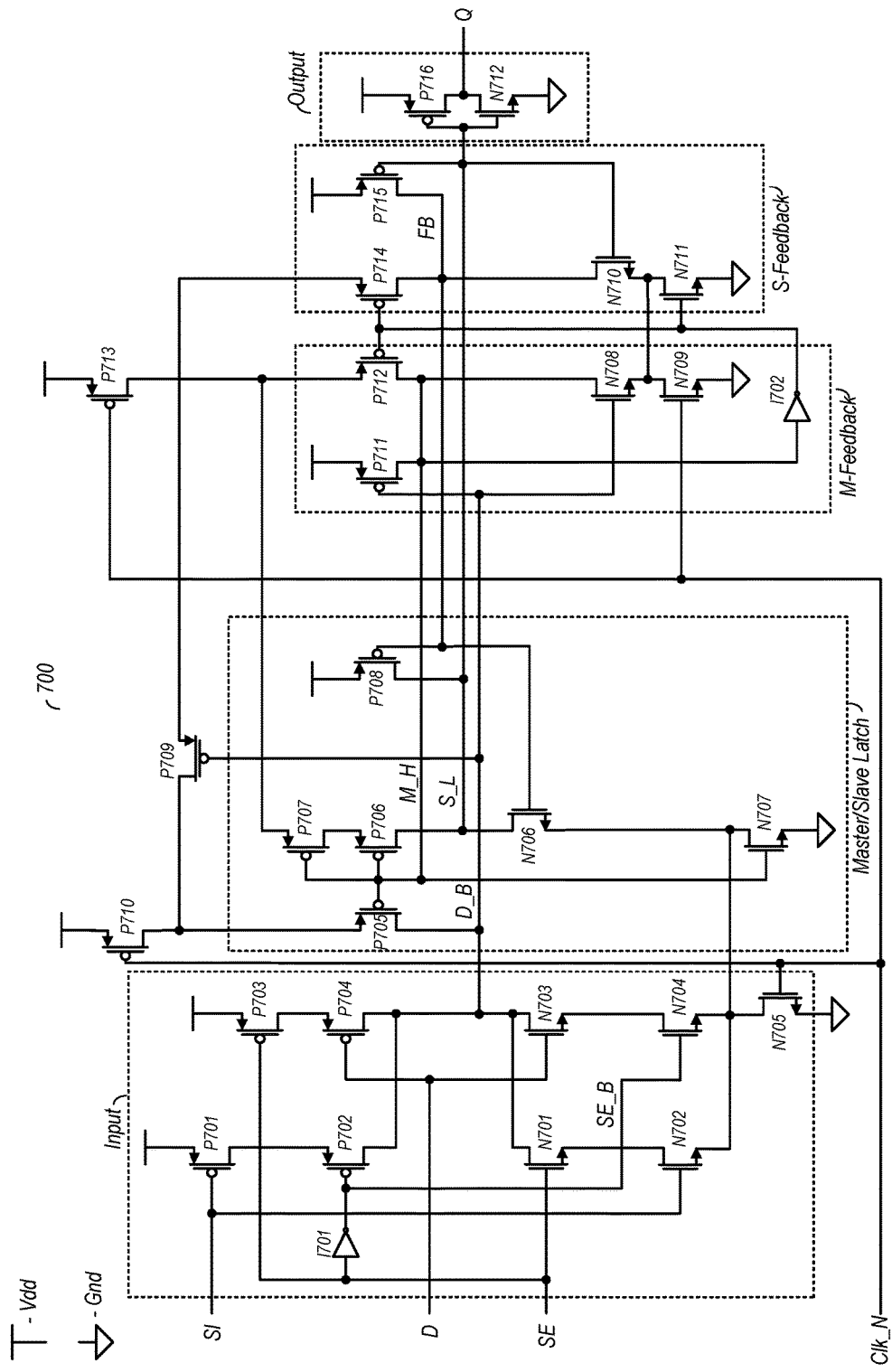
FIG. 7 is a schematic diagram of a third embodiment of a flip-flop circuit.

FIG. 7 is a schematic diagram of a third embodiment of a flip-flop circuit. In the embodiment shown, flip-flop 700 includes an input circuit, a master/slave latch, a master feedback circuit, a slave feedback circuit, and an output circuit. As with the previous two embodiments, the input circuit is arranged in a similar manner, although this embodiment includes an extra transistor (N705). Furthermore, as with the embodiment shown in FIG. 6, flip-flop 700 is falling edge triggered, hence the labeling of the input clock signal as Clk_N.

Due to the arrangement of the input circuit in the embodiment shown, D_B can only fall low when the input clock signal is high. If a logic high is input into D when the clock is high, a pulldown path is created between D_B and ground, through transistors N703, N704, and N705 (N704 being active due to SE being low and thus SE_B being high). The low on D_B is propagated to the gate terminal of P711, which activates to pull M_H high. Additionally, the low on D_B also causes activation of P709. The high on M_H activates transistor N707, and also causes a low to be output from inverter I702. The low output from inverter I702 activates P712 and P714.

Upon the transition of the input clock signal from high to low, transistors P710 activated, thereby resulting in a pull-up path between FB and Vdd, through P710, P709, and P714. When FB is pulled high, transistor N706 is activated, thereby resulting in a pull-down path between S_L and ground. When S_L falls low, the output circuit provides a logic high on the output Q.

When a logic low is provided to the D input, P704 is activated and thus a pull-up path is provided between D_B and Vdd, via P703 (which is active due to SE being low). When D_B transitions high, N708 is activated, and with N709 active (due to the input clock being low at this time), a pulldown path is provided to pull M_H low. The low on M_H causes activation of P706 and P707. Additionally, the low in M_H results in a logic high output from I702, thereby causing activation of N711.

When Clk_N falls low, the activation of P713 provides a pull-up path between S_L and Vdd, through P706, P707, and P713. When S_L is pulled high, N710 is activated and FB is pulled low through N710 and N711. Additionally, the high on S_L is inverted by the output circuit, resulting in a low on the Q output.

As with the previously discussed flip-flop embodiments, flip-flop 700 includes a number of transistors coupled to receive the input clock signal on respective gate terminals, namely N705, P710, N709, and P713. Each of these transistors is part of a pull-up or pull-down path that, when active, drives one of the internal data nodes of the circuit. As with the previously discussed embodiments, there are no inversions of the clock signal in flip-flop 700.

Figure 8:
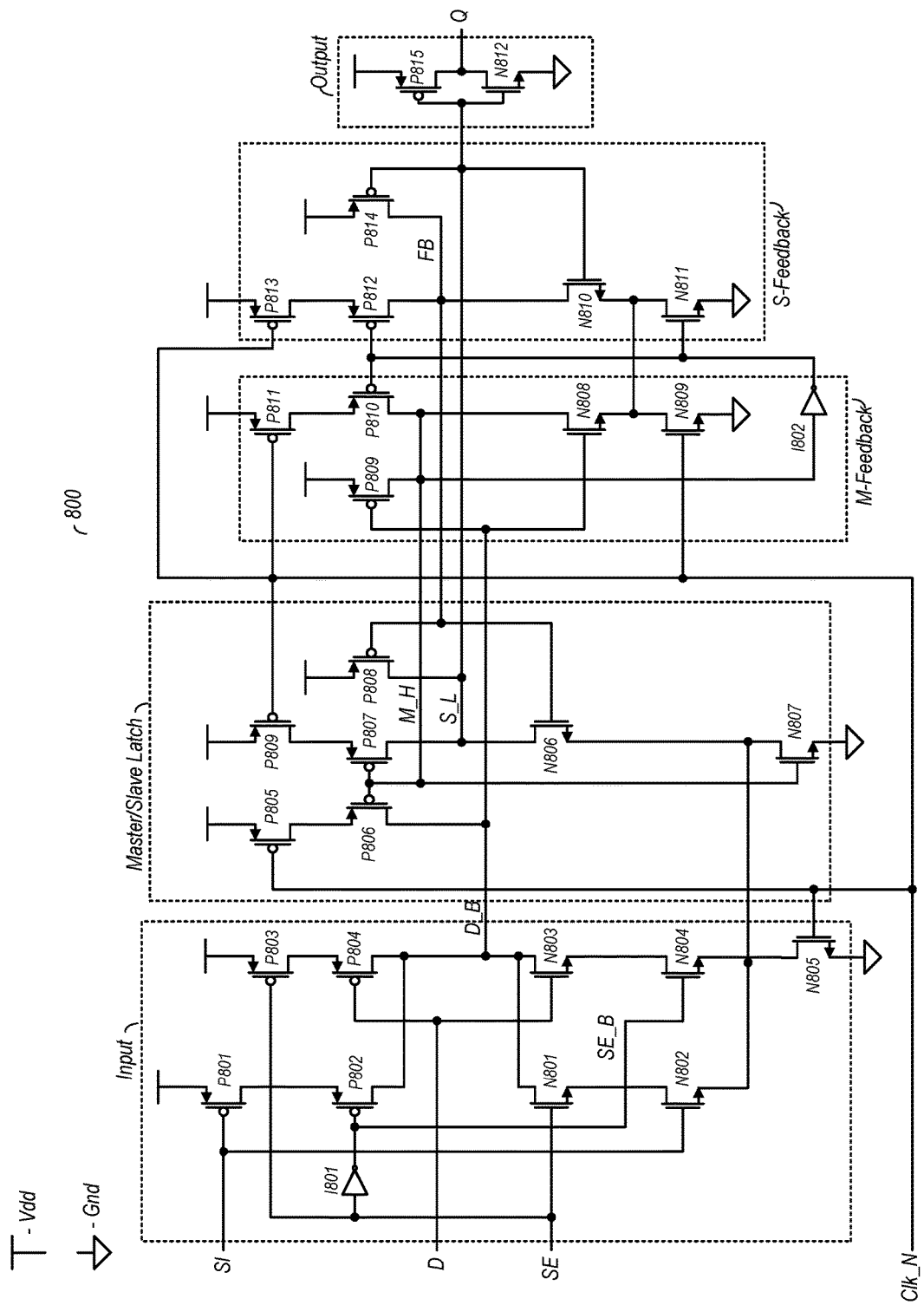
FIG. 8 is a schematic diagram of a fourth embodiment of a flip-flop circuit.

FIG. 8 is a schematic diagram of a fourth embodiment of a flip-flop circuit. Flip-flop 800 in the embodiment shown includes an input circuit, a master/slave latch circuit, a master feedback circuit, and a slave feedback circuit. Similar to the embodiment discussed with reference to FIG. 7, flip-flop 800 is a negative-edge triggered flip-flop. Furthermore, the input circuit of flip-flop 800 is arranged in substantially the same manner as that of flip-flop 700.

In this embodiment, a logic low received at D results in D_B being pulled high through P803 and P804 (the former being activated responsive to the low on SE). The resulting high on D_B causes activation of N808, resulting in a pulldown path between M_H and ground, through N808 and N809, when Clk_N is high. When M_H is pulled low, P806 and P807 are activated, while I802 outputs a logic high to activate N811.

When the input clock signal falls low, P809 is activated, thereby creating a pull-up path between S_L and Vdd, through P807 and P809. When S_L is pulled high, N810 is activated, resulting in a pulldown path between FB and ground, through N810 and N811. Additionally, the high on S_L is inverted by the output circuit to produce a logic low on the Q output.

A logic high received on the D input results in activation of a pulldown path between D_B and ground, via N803, N804 (active due to SE_B being high) and N805 (active due to Clk_N being high during its inactive phase). When D_B is pulled low, P809 is activated to cause M_H to be pulled high toward Vdd. When M_H is high, N807 is activated, while I802 outputs a low to activate P810 and P812.

When the input clock signal falls low, P813 is activated to create a pull-up path between FB and Vdd, through P812 and P813. The high on FB in turn causes activation of N806, creating a pulldown path between S_L and ground, through N806 and N807. The resulting low on S_L results in the inversion by the output circuit producing a logic high on the Q output.

The transistors of flip-flop 800 that are coupled to receive the input clock signal on their respective gate terminals are N805, P805, P809, N809, P811, and P813. Each of these transistors, in conjunction with at least one other transistor, serves to provide either a pull-up path or a pulldown path to drive an internal data node of flip-flop 800. Additionally, flip-flop 800 includes no transistor arrangement that results in an inversion of the input clock signal.

Figure 9:
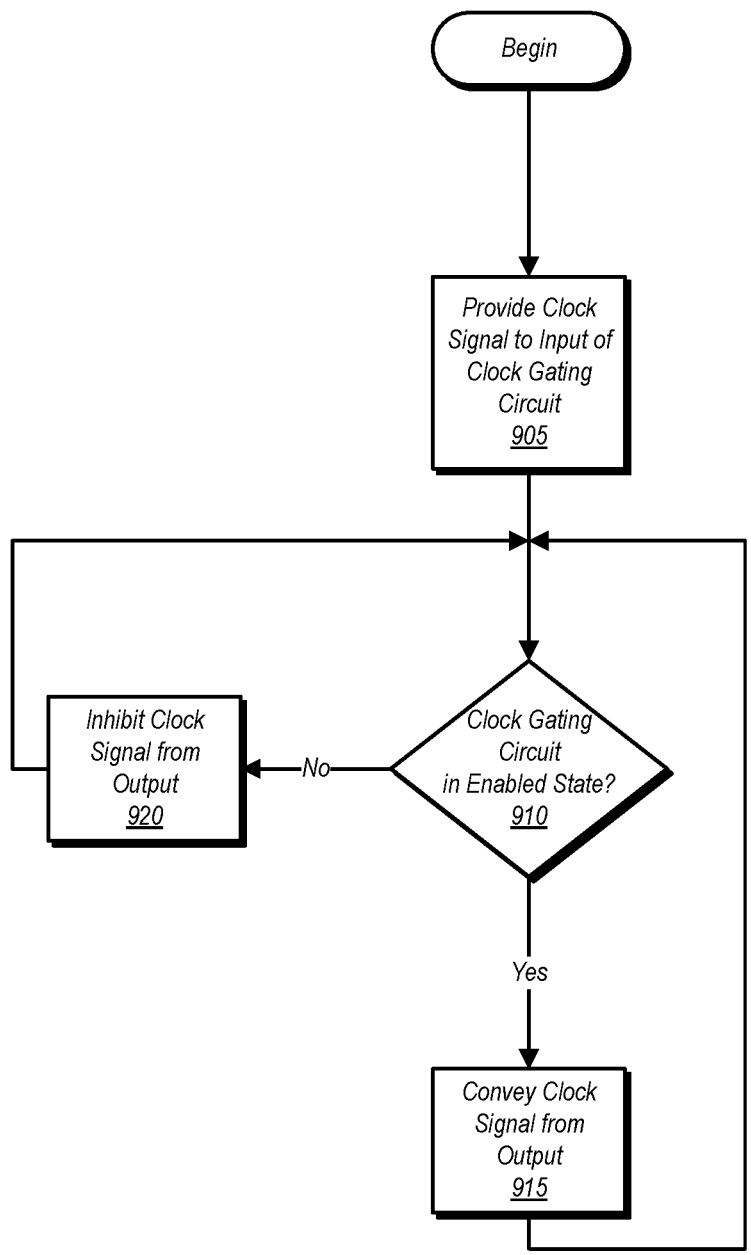
FIG. 9 is a flow diagram illustrating one embodiment of a method for operating a clock gating circuit.

FIG. 9 is a flow diagram illustrating one embodiment of a method for operating a clock gating circuit. Method 900 as shown in FIG. 9 may be performed by any of the clock gating circuits discussed above, as well as by variations of these circuits that are not explicitly discussed herein.

Method 900 includes the providing of a clock signal to an input of a clock gating circuit (block 905). If the clock gating circuit is in an enabled state (block 910, yes) then the circuit conveys a corresponding clock signal from its output (block 915). The method thereafter returns to block 910. If the clock gating circuit is not in an enabled state (block 910, no), then the circuit inhibits the corresponding clock signal from being provide from its output (block 920). When the clock signal is inhibited, the level of the clock gating circuit output is held to a single logic level (which may be a logic high or a logic low). Moreover, the circuits performing method 900 may be arranged such that no dynamic power is consumed (due to the changing levels of the input clock signal) when the clock gating circuit is not in the enabled state.

Figure 10:
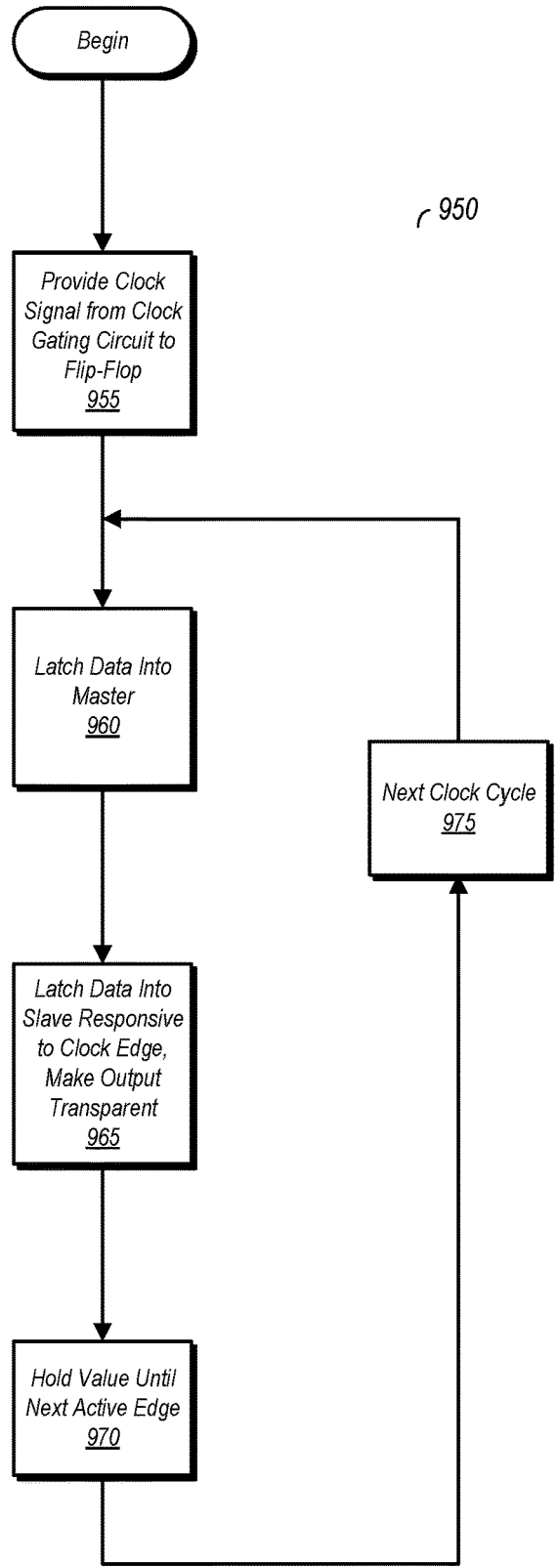
FIG. 10 is a flow diagram illustrating one embodiment of a method for operating a flip-flop circuit.

FIG. 10 is a flow diagram illustrating one embodiment of a method for operating a flip-flop circuit. Method 950 may be performed with various embodiments of the circuits discussed above, including variations not explicitly discussed herein. While method 950 is discussed here in the context of a single-bit flip-flop, it is to be understood that the operation described may be extended to multi-bit flip-flops.

Method 950 begins with the providing of a clock signal from a clock gating circuit to a corresponding flip-flop (block 955). Data received on a data input of the flip-flop is latch into a master latch during an inactive portion of the clock signal (block 960), e.g., when the clock is low on a positive edge triggered flip-flop. When the when the clock signal transitions to the active phase (e.g., at the rising edge of a positive edge triggered flip-flop), data is latched into a slave latch, and the output of the circuit is transparent (block 965). The corresponding logic value that is output from the flip-flop is then held at least until the next active edge of the clock signal (block 970). Thereafter, the method progresses to the next clock cycle (block 975), returning to block 960.

Figure 11:
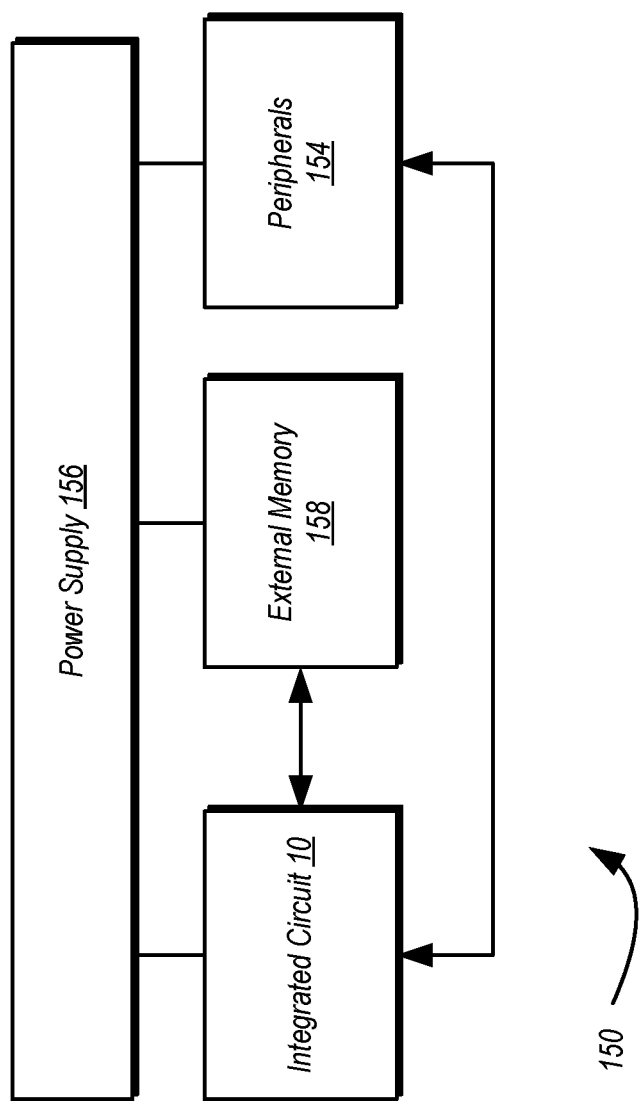
FIG. 11 is a block diagram of one embodiment of an exemplary system.

Turning next to FIG. 11, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. A circuit comprising:
   an input circuit configured to receive an enable signal;
   clock enable circuitry configured to receive a clock signal;
   a latch configured to capture and store an enabled state of the enable signal, wherein the enabled state corresponds to the enable signal being in an active state, wherein the latch comprises a feed forward circuit having a feed forward node and a feedback circuit having a feedback node, wherein the feedback circuit is coupled to provide a feedback signal to the feed forward circuit, wherein the feed forward circuit is configured to capture a current state of the enable signal when the clock signal is inactive, and wherein the feedback circuit is configured to cause the feed forward circuit to retain the enabled state of the enable signal when the clock signal transitions from a logic high state to a logic low state, wherein respective states of a signal on the feed forward node and the feedback signal are independent of a state of the clock signal when the latch is in the enabled state, and wherein the state of the feedback signal is dependent on the state of the signal of the feed forward node;
   an output circuit configured to provide an output signal corresponding to a state of the clock signal when the latch is storing the enabled state;
   wherein the circuit is configured such that dynamic power consumption does not change responsive to a change in the state of the clock signal when the latch is not storing the enabled state.

2. The circuit as recited in claim 1, wherein the input circuit is coupled to receive a test enable signal, and wherein the latch is further configured to capture and store the enabled state responsive to assertion of the test enable signal.

3. The circuit as recited in claim 2, wherein the latch is configured to cause the output circuit to hold the output signal at an inactive state, irrespective of a state of the clock signal, when neither of the enable and test enable signals are asserted.

4. The circuit as recited in claim 1, wherein the latch is configured to block transitions of the feed forward node when the clock signal is active.

5. The circuit as recited in claim 1, wherein, responsive to assertion of the enable signal, the feed forward circuit is configured to cause the feed forward node to be driven to the enabled state responsive to assertion of the enable signal and the clock signal entering the logic low state.

6. The circuit as recited in claim 1, wherein the feedback circuit is configured to provide a feedback signal on the feedback node in a state logically opposite that of a state of the feed forward node, wherein the feed forward circuit is configured to, when the clock signal is in the logic low state, set the state of the feed forward node based on the logically opposite state of the feedback signal.

7. The circuit as recited in claim 1, wherein the clock enable circuitry is configured to block transitions of the output signal when the clock signal is in the logic high state, irrespective of any transitions of the enable signal or any transitions of a test enable signal received by the input circuit.

8. The circuit as recited in claim 1, wherein the clock enable circuit is circuitry is configured to block transitions of the output signal when the enable signal and a test enable signal are both inactive.

9. A method comprising:
   providing a clock signal to a clock gating circuit, the clock signal having an active state corresponding to a first logic level and an inactive state corresponding to a second logic level;
   enabling the clock gating circuit responsive to assertion of an enable signal;
   storing, in a latch, an enabled state of the enable signal, wherein storing the enabled state includes a feed forward circuit capturing the enabled state of the enable signal when the clock signal is inactive and a feedback circuit providing a feedback signal to the feed forward circuit to cause the feed forward circuit to retain the enabled state of the enable signal when the clock signal transitions from the active state to the inactive state and wherein respective states of a signal on a feed forward node of the feed forward circuit and the feedback signal are independent of a state of the clock signal when the clock gating circuit is in the enabled state, and wherein the state of the feedback signal is dependent on the state of the signal of the feed forward node;
   providing an output signal corresponding to a current state of the clock signal when the clock gating circuit is enabled;
   holding the output signal to a predetermined state, irrespective of a state of the clock signal, when the clock gating circuit is not enabled; and
   inhibiting dynamic power consumption by the clock gating circuit due to state transitions of the clock signal when the clock gating circuit is not enabled.

10. The method as recited in claim 9, further comprising enabling the clock gating circuit responsive to at least one of the following:
    receiving an enable signal in an asserted state when the clock signal is in the inactive state;
    receiving a test enable signal in the asserted state when the clock signal is in the inactive state.

11. The method as recited in claim 9, further comprising clock enable circuitry in the clock gating circuit blocking transitions of the output signal, irrespective of transitions of the clock signal when the clock gating circuit is not enabled.

12. A clock gating circuit, comprising:
    an input circuit configured to receive an enable signal;
    clock enable circuitry configured to receive a clock signal, the clock signal having an active state corresponding to a first logic level and an inactive state corresponding to a second logic level;
    a latch configured to capture and store, on a storage node, a state of the enable signal, wherein the latch is configured to capture a current state of the enable signal on the storage node when the clock signal is in an inactive state, and further configured to inhibit logical transitions of the storage node when the clock signal is in an active state, wherein the latch includes a feed forward circuit having a feed forward node and a feedback circuit, wherein the feedback circuit includes an input coupled to the storage node and is coupled to provide a feedback signal to the feed forward circuit, wherein the feed forward circuit is configured to retain, responsive to the feedback signal, an asserted state of the enable signal on the storage node when the clock signal transitions to the inactive state and wherein respective states of a signal on the feed forward node and the feedback signal are independent of state of the clock signal when the clock gating circuit is in the enabled state, and wherein the state of the feedback signal is dependent on the state of the signal of the feed forward node; and an output circuit configured to provide an output signal corresponding to a current state of the clock signal when the latch is storing the asserted state of the enable signal;

wherein the clock enable circuitry is configured to enable transitions of the output signal when the latch is storing the asserted state of the enable signal, and further configured to inhibit dynamic power consumption by the clock gating circuit, irrespective of transition by the clock signal, when the latch is not storing the asserted state of the enable signal.

13. The clock gating circuit as recited in claim 12, wherein the clock enable circuitry is configured to block transitions of the output signal when the clock signal is in the inactive state, irrespective of a state of the enable signal.

14. The clock gating circuit as recited in claim 12, wherein the clock enable circuitry is configured to block transitions of the output signal when the enable signal and a test enable signal are both inactive.

15. The clock gating circuit as recited in claim 12, wherein the input circuit is further configured to receive a test enable signal, wherein responsive to assertion of the test enable signal and the clock signal being in the inactive state, the latch is configured to capture and store, on the storage node, an asserted state of the test enable signal.

16. The clock gating circuit as recited in claim 15, wherein the clock enable circuitry is configured to allow transitions of the output signal, responsive to transitions of the clock signal, when the asserted state of the test enable signal is stored on the storage node.

* * * * *